(12) United States Patent
Huang et al.

(10) Patent No.: US 11,882,675 B2
(45) Date of Patent: Jan. 23, 2024

(54) INTERFACE CONNECTOR

(71) Applicant: Dongguan Luxshare Technologies Co., Ltd, Dongguan (CN)

(72) Inventors: Bin Huang, Dongguan (CN); RongZhe Guo, Dongguan (CN); HongJi Chen, Dongguan (CN); TieSheng Li, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 200 days.

(21) Appl. No.: 17/515,851

(22) Filed: Nov. 1, 2021

(65) Prior Publication Data

US 2022/0287205 A1  Sep. 8, 2022

(30) Foreign Application Priority Data

Mar. 2, 2021 (CN) .......................... 202110229729.6

(51) Int. Cl.
| | | |
|---|---|---|
| *H05K 7/20* | (2006.01) | |
| *H01R 9/05* | (2006.01) | |
| *H01R 13/04* | (2006.01) | |

(52) U.S. Cl.
CPC ....... *H05K 7/20445* (2013.01); *H01R 9/0506* (2013.01); *H01R 13/04* (2013.01)

(58) Field of Classification Search
CPC ........... H05K 7/20445; H05K 7/20154; H05K 7/20418; H05K 7/20436; H01R 9/0506; H01R 13/04; H01R 13/6587; H01R 13/6583; H01R 13/533; G02B 6/4269; G02B 6/4292; G02B 6/4293
See application file for complete search history.

(56) References Cited

U.S. PATENT DOCUMENTS

| | | | | |
|---|---|---|---|---|
| 9,668,379 | B1* | 5/2017 | Bucher | .............. H05K 7/20436 |
| 2010/0232800 | A1* | 9/2010 | Meadowcroft | ...... G02B 6/4246 |
| | | | | 398/139 |

FOREIGN PATENT DOCUMENTS

| | | | | |
|---|---|---|---|---|
| CN | 108061943 | A | 5/2018 | |
| CN | 110197962 | A * | 9/2019 | ........... G02B 6/4269 |
| CN | 110364884 | A | 10/2019 | |
| CN | 111541074 | A | 8/2020 | |
| CN | 211789719 | U | 10/2020 | |
| CN | 212160165 | U | 12/2020 | |

* cited by examiner

*Primary Examiner* — Jean F Duverne
(74) *Attorney, Agent, or Firm* — Birch, Stewart, Kolasch & Birch, LLP

(57) ABSTRACT

An interface connector, comprising a housing, a first heat dissipating member, and a second heat dissipating member. A first accommodating space and a second accommodating space are disposed in the housing. The first accommodating space is adjacent to the second accommodating space. The first accommodating space accommodates a first mating connector. The second accommodating space accommodates a second mating connector. The first heat dissipating member is disposed at the outside of the housing and passes through the housing. The first heat dissipating member extends into the first accommodating space to be connected to the first mating connector. The second heat dissipating member is disposed in the housing. The second heat dissipating member extends into the second accommodating space to be connected to the second mating connector.

11 Claims, 7 Drawing Sheets

INTERFACE CONNECTOR

CROSS-REFERENCE TO RELATED APPLICATION

This application claims the priority benefit of Chinese Patent Application Serial Number 202110229729.6 filed on Mar. 2, 2021, the full disclosure of which is incorporated herein by reference.

BACKGROUND

Technical Field

The present disclosure relates to the technical field of heat dissipation for interface connectors, particularly to an interface connector capable of dissipating heat for a stack-type signal module.

Related Art

Conventional interface connectors are used for insertion of optical modules, which control the laser diode to emit optical signals corresponding to electric signals to convert electric signals into optical signals through a chip based on electric signals. During operation, chips and laser diodes in the optical module would generate heat. When the temperature of optical modules rises to certain level, the operation of optical modules would be affected without performing heat dissipation. Considering the signal transmission rate is increasing for conventional interface connectors, to allow optical signals to be transmitted over a long distance in an optical cable, the operating power of chips of optical modules is increasing accordingly. Thus, heat dissipation for interface connectors is a critical issue.

SUMMARY

The embodiments of the present disclosure provide an interface connector tended to solve the problem of heat dissipation for conventional interface connectors used for stack-type signal modules.

The present disclosure provides an interface connector, comprising a housing, a first heat dissipating member, and a second heat dissipating member. A first accommodating space and a second accommodating space are disposed in the housing. The first accommodating space is adjacent to the second accommodating space. The first accommodating space accommodates a first mating connector. The second accommodating space accommodates a second mating connector. The first heat dissipating member is disposed at the outside of the housing and passes through the housing. The first heat dissipating member extends into the first accommodating space to be connected to the first mating connector. The second heat dissipating member is disposed in the housing. The second heat dissipating member extends into the second accommodating space to be connected to the second mating connector.

The housing of the interface connector comprises a first outer surface and a second outer surface adjacent to the first outer surface. The first heat dissipating member comprises a first heat dissipating member body and a first extending part. The first heat dissipating member body is disposed on the first outer surface. The first extending part extends from the first heat dissipating member body along the second outer surface.

The first heat dissipating member of the interface connector further comprises a second extending part extending from the first heat dissipating member body into the first accommodating space through the housing. The second extending part abuts against the first mating connector inserted in the first accommodating space.

The interface connector further comprises a connecting member passing through the housing and is connecting with the first heat dissipating member and the second heat dissipating member.

The first heat dissipating member of the interface connector comprises a first through hole. The housing comprises a second through hole. The second heat dissipating member comprises a groove hole. The connecting member passes through the first through hole and the second through hole in order and is engaged with the groove hole.

The second heat dissipating member of the interface connector comprises a second heat dissipating member body and a third extending part. The third extending part extends from the second heat dissipating member body into the second accommodating space and abuts against the second mating connector inserted in the second accommodating space.

The housing of the interface connector comprises a partitioning part partitioning the inner space of the housing to form the first accommodating space and the second accommodating space. The second heat dissipating member is engaged with the partitioning part.

The interface connector comprises a first elastic member disposed in the first accommodating space. The first elastic member is opposite to the first heat dissipating member. Two opposite surfaces of the first mating connector abut against the first heat dissipating member and the first elastic member, respectively.

The interface connector comprises a second elastic member disposed in the second accommodating space. The second elastic member is opposite to the second heat dissipating member. Two opposite surfaces of the second mating connector abut against the second heat dissipating member and the second elastic member, respectively.

The interface connector comprises a third heat dissipating member disposed in the housing. The housing comprises a third accommodating space and a fourth accommodating space. The third accommodating space accommodates a third mating connector. The fourth accommodating space accommodates a fourth mating connector. The first heat dissipating member extends into the third accommodating space to be connected to the third mating connector. The third heat dissipating member extends into the fourth accommodating space to be connected to the fourth mating connector. The third heat dissipating member is connected with the first heat dissipating member.

In the embodiments of the present disclosure, the first heat dissipating member is disposed at the outside of the housing and is connected to the first mating connector, and the second heat dissipating member is disposed inside the housing and is connected to the second mating connector. The second heat dissipating member is connected to the first heat dissipating member. The heat from the first mating connector is transferred to the first heat dissipating member by heat conduction and then is dissipated to the air through the first heat dissipating member. The heat from the second mating connector stacked with the first mating connector is transferred to the second heat dissipating member by heat conduction, then is transferred from the second heat dissipating member to the first heat dissipating member by heat conduction, and finally escapes to the air through the first heat dissipating member. By disposing the first heat dissipating member and the second heat dissipating member at the outside and the inside of the housing, and by connecting the first heat dissipating member with the second heat dissipating member, the heat emitted by the first mating connector and the second mating connector can be effectively dissipated through the connected first heat dissipating member and the second heat dissipating member. The heat dissipation issue of optical modules equipped with high power chips can be well handled.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/ substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

Figure 1:
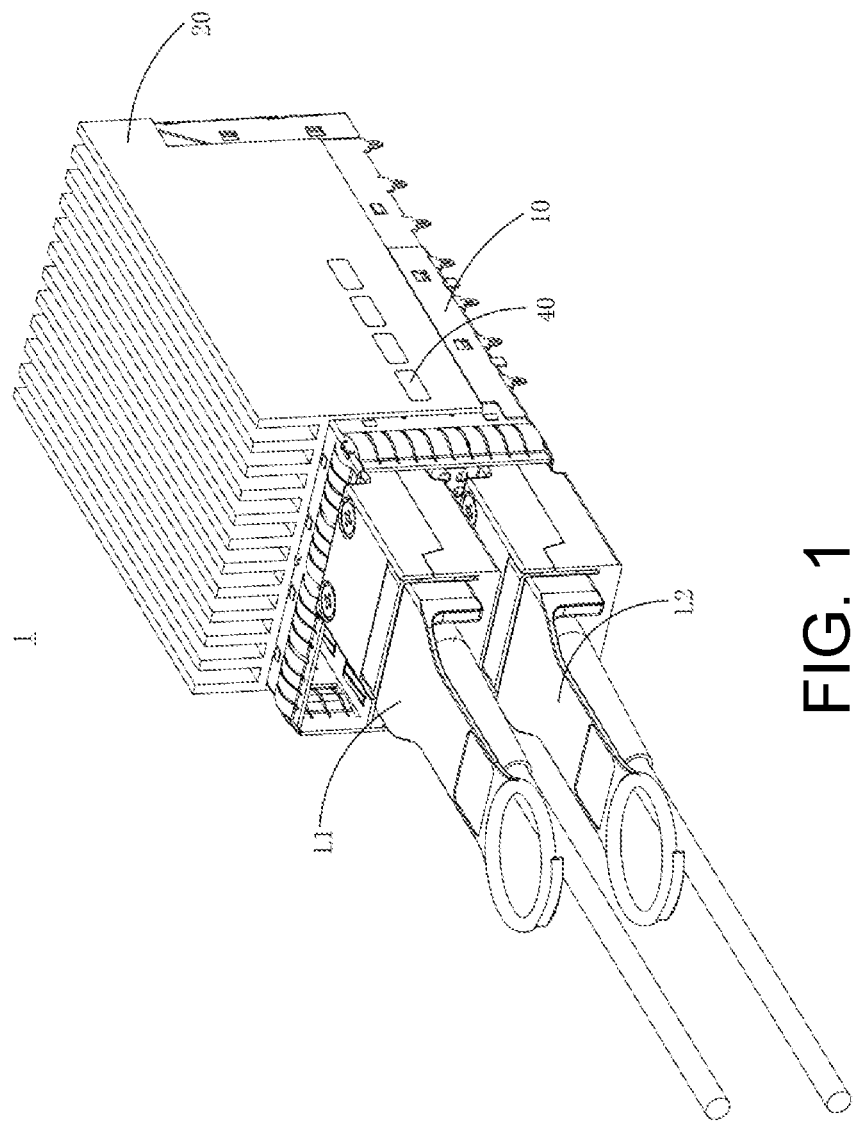
FIG. 1 is a perspective view of connection between an interface connector with an optical module of an embodiment of the present disclosure.
Figure 2:
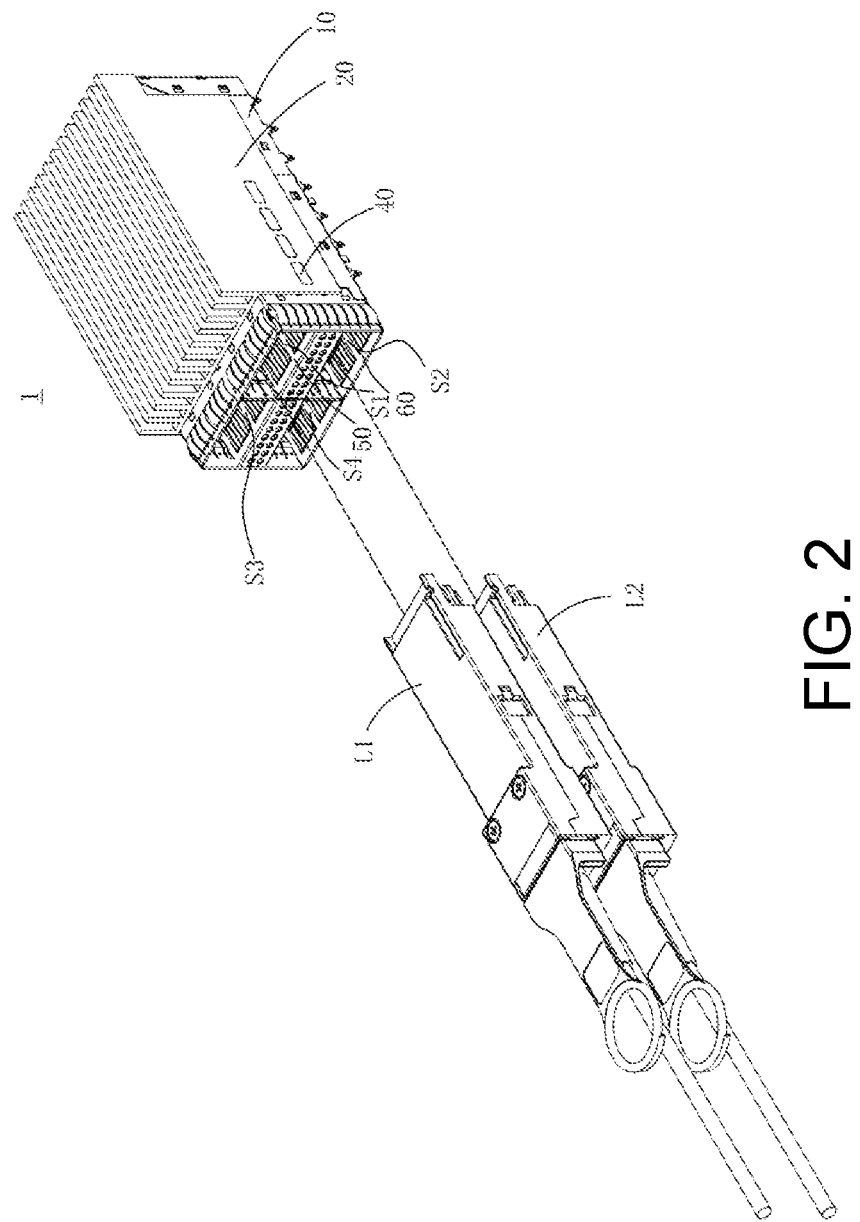
FIG. 2 is a perspective view of the interface connector and the optical module of FIG. 1 of the present disclosure.
Figure 3:
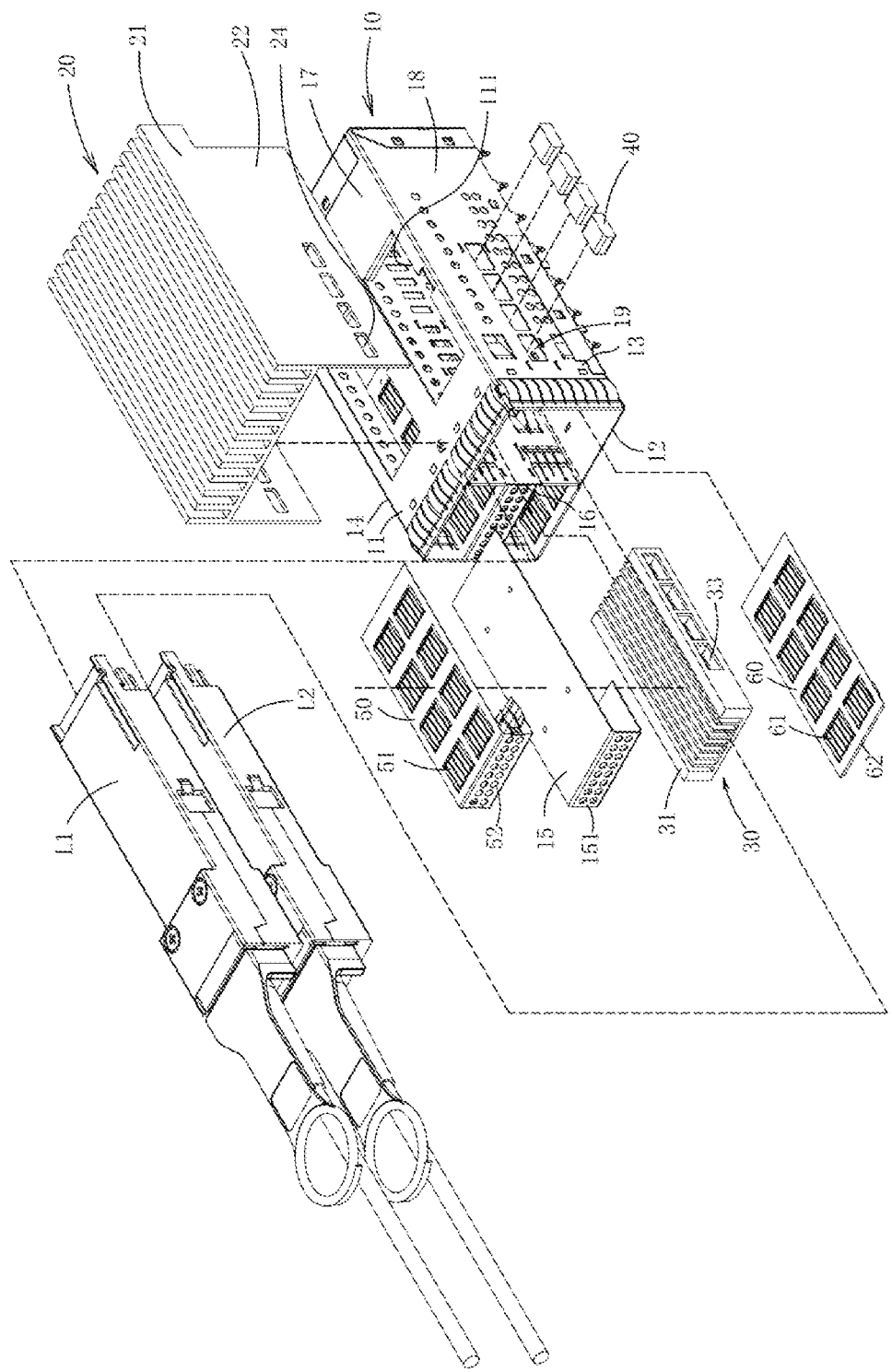
FIG. 3 is an exploded view of the interface connector of FIG. 1.

FIG. 1 is a perspective view of connection between an interface connector with an optical module of an embodiment of the present disclosure. FIG. 2 is a perspective view of the interface connector and the optical module of FIG. 1 of the present disclosure. FIG. 3 is an exploded view of the interface connector of FIG. 1. As shown in the figures, in this embodiment, an interface connector is provided, which comprises a housing 10, a first heat dissipating member 20, and a second heat dissipating member 30. The housing 10 of this embodiment comprises a top wall 11, a bottom wall 12, and two opposite sidewalls 13 and 14 respectively connecting with the top wall 11 and the bottom wall 12.

As shown in FIG. 2 and FIG. 3, in this embodiment, the housing 10 further comprises a partitioning part 15 partitioning the inner space of the housing 10 to form a first accommodating space S1 and a second accommodating space S2. In this embodiment, the partitioning part 15 is a plate and is connected with the sidewall 13. The partitioning part 15, the top wall 11, and the sidewall 13 form the first accommodating space S1. The partitioning part 15, the bottom wall 12, and the sidewall 13 form a second accommodating space S2. Thus, the first accommodating space S1 and the second accommodating space S2 form a stack-type structural configuration.

In this embodiment, the housing 10 also comprises a separating part 16. The separating part 16 connects the top wall 11 and the bottom wall 12 and divides the inner space of the housing 10 to a left part and a right part. The partitioning part 15 connects the sidewall 13 and the separating part 16 and divides both the left and right parts into a stack-type structural configuration. On the right part are the first accommodating space S1 and the second accommodating space S2, and on the left part are a third accommodating space S3 and a fourth accommodating space S4. A first mating connector L1 is inserted into the first accommodating space S1 through a first interface M1 of the housing 10. A second mating connector L2 is inserted into the second accommodating space S2 through a second interface M2 of the housing 10. Although other mating connectors are not shown in the figures, they could also be inserted into the third accommodating space S3, and the fourth accommodating space S4.

Figure 4:
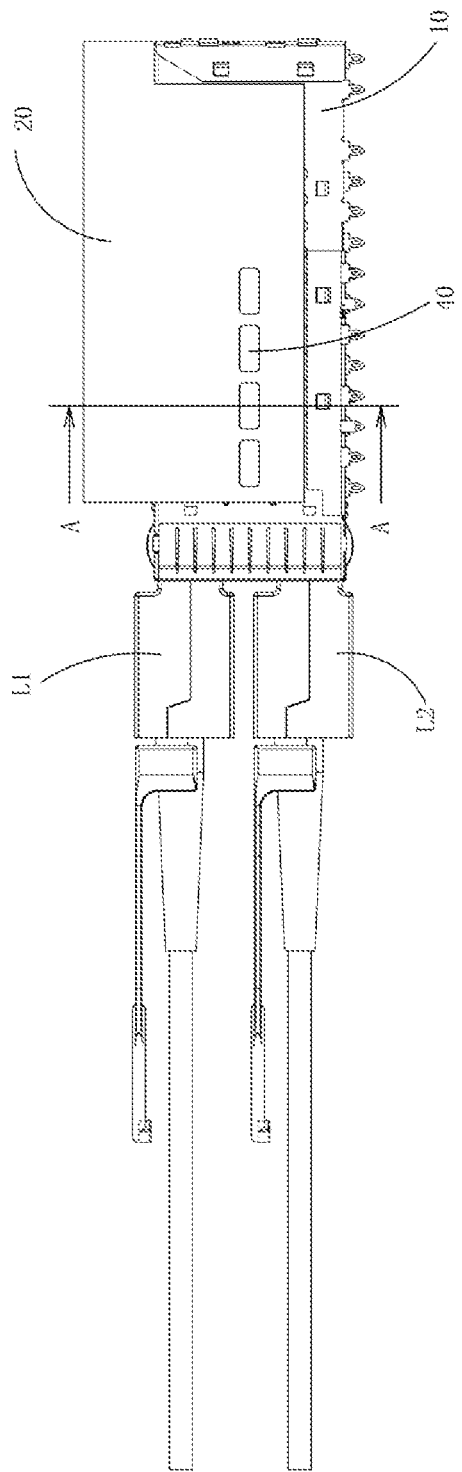
FIG. 4 is a side view of the connection between the interface connector with the optical module of FIG. 1.
Figure 5:
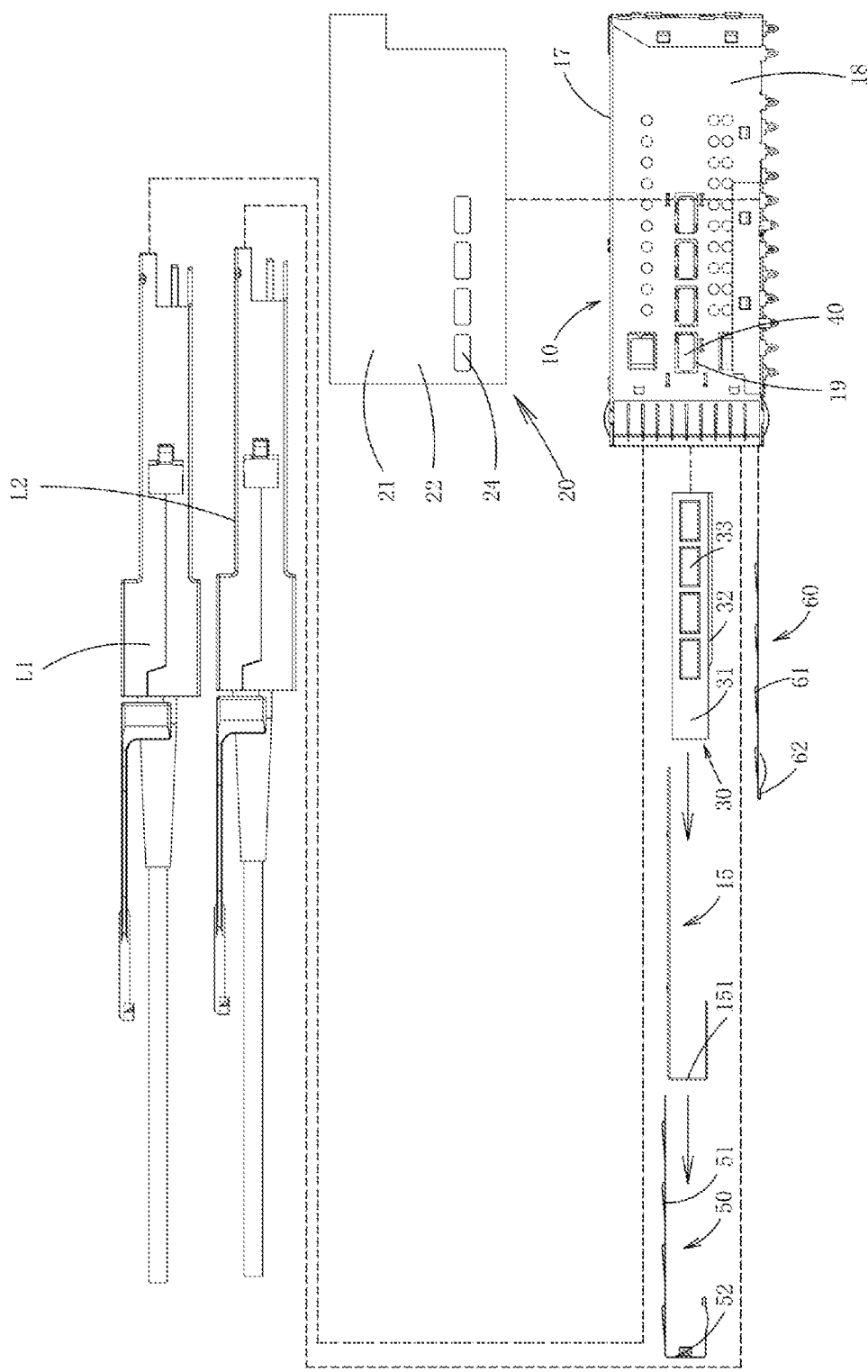
FIG. 5 is an exploded view of the connection between the interface connector with the optical module of FIG. 4.
Figure 6:
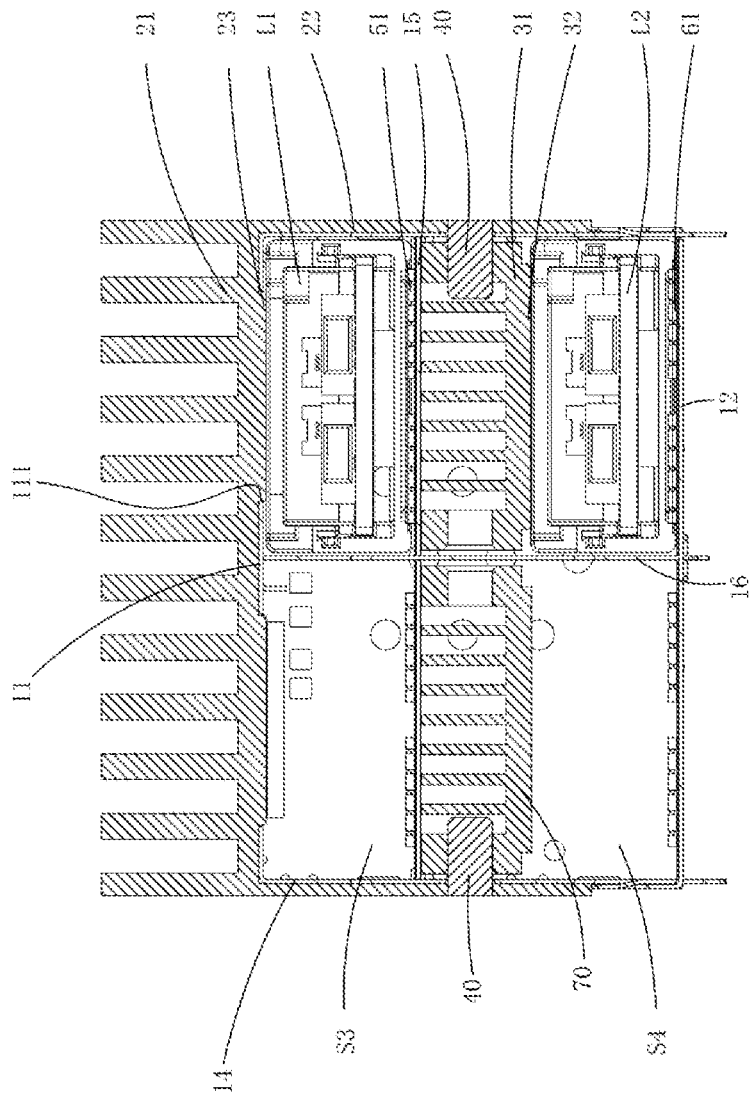
FIG. 6 is a cross-sectional view along line A-A of the connection of the interface connector with the optical module of FIG. 4.

FIG. 4 is a side view of the connection between the interface connector with the optical module of FIG. 1. FIG. 5 is an exploded view of the connection between the interface connector with the optical module of FIG. 4. FIG. 6 is a cross-sectional view along line A-A of the connection of the interface connector with the optical module of FIG. 4.

Figure 7:
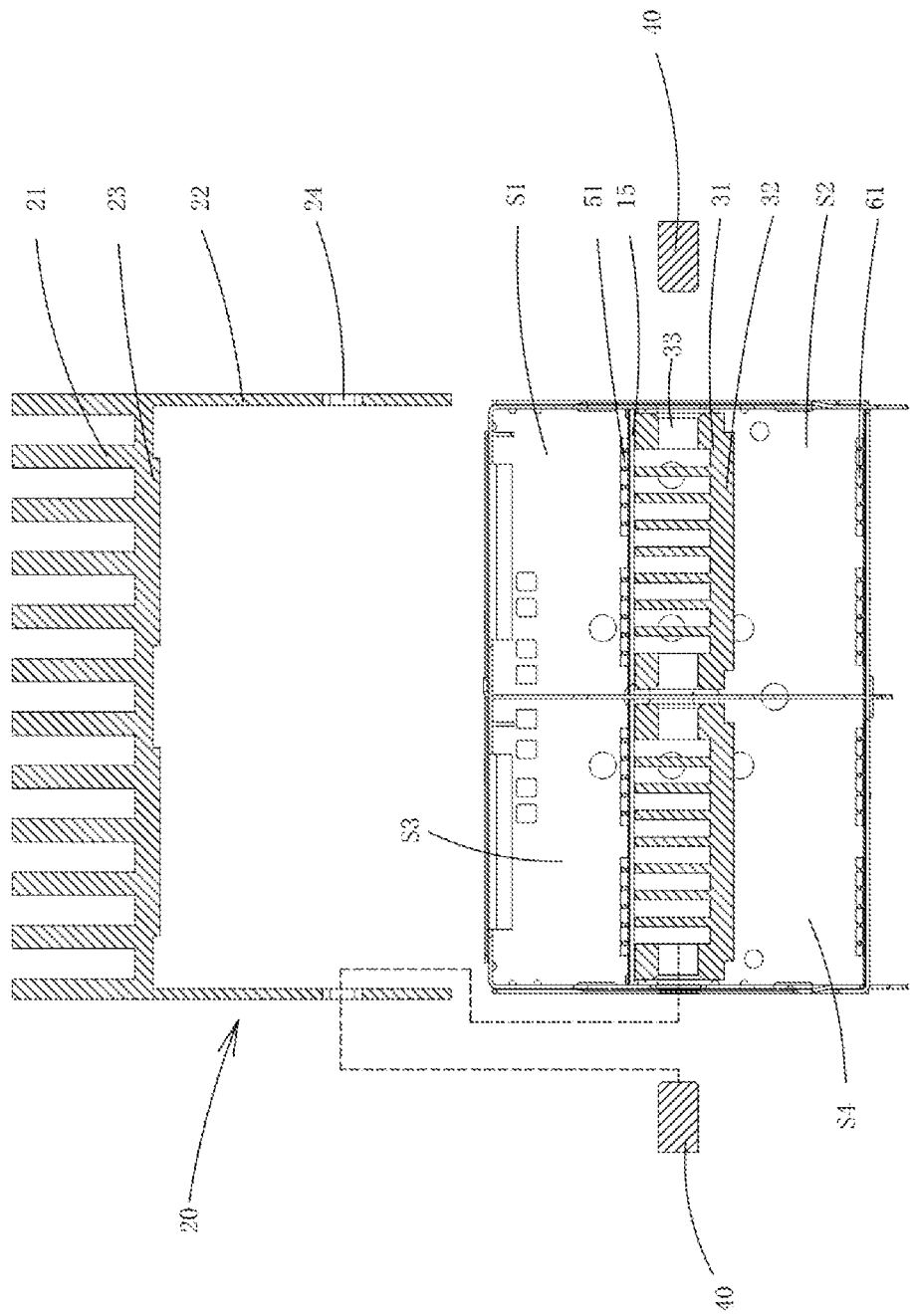
FIG. 7 is an exploded view of the interface connector of FIG. 6.

FIG. 7 is an exploded view of the interface connector of FIG. 6. As shown in the figures, the first heat dissipating member 20 is disposed at the outside of the housing 10 and passes through the housing 10. The first heat dissipating member 20 extends into the first accommodating space S1 to be connected to the first mating connector L1. The second heat dissipating member 30 is disposed in the housing 10 and extends into the second accommodating space S2 to be connect to the second mating connector L2. The second heat dissipating member 30 is connected with the first heat dissipating member 20.

As shown in FIG. 2, FIG. 4, and FIG. 6, the housing 10 comprises a first outer surface 17 connected with a second outer surface 18. The first outer surface 17 is an outer surface of the top wall 11. The second outer surface 18 is an outer surface of the sidewall 13. The first heat dissipating member 20 comprises a first heat dissipating member body 21 and a first extending part 22. The first heat dissipating member body 21 is disposed on the first outer surface 17. The first extending part 22 extends from one side end of the first heat dissipating member body 21 along the second outer surface 18. As shown in FIG. 6, the first extending part 22 is orthogonal to the first heat dissipating member body 21. The first heat dissipating member body 21 comprises a plurality of fin-type heat dissipating components. The first heat dissipating member 20 further comprises a second extending part 23 extending from the first heat dissipating member body 21 into the first accommodating space S1 through the housing 10. The second extending part 23 abuts against the first mating connector L1 inserted in the first accommodating space S1. As shown in FIG. 3 and FIG. 6, an opening 111 is disposed on the top wall 11 of the housing 10. When the first heat dissipating member body 21 is disposed on the first outer surface 17 of the top wall 11 of the housing 10, the second extending part 23 would pass through the opening 111 and extends into the first accommodating space S1. When the first mating connector L1 is inserted into the first accommodating space S1, the second extending part 23 would abut against a top end of the first mating connector L1. The heat generated by the first mating connector L1 would be conducted to the first heat dissipating member body 21 through the second extending part 23 by heat conduction, and particularly dissipated through the fin-type heat dissipating component of the first heat dissipating member body 21 along with external air flow by heat convection. In this embodiment, the first heat dissipating member 20 is made of materials with excellent heat conductivity, such as metallic copper.

As shown in FIG. 3, FIG. 5, FIG. 6, and FIG. 7, a front end of the partitioning part 15 of the housing 10 comprises a holding part 151. The second heat dissipating member 30 is engaged in the holding part 151 to be positioned in the housing 10. As shown in FIG. 5 and FIG. 6, the second heat dissipating member 30 comprises a second heat dissipating member body 31 and a third extending part 32. The third extending part 32 extends from the second heat dissipating member body 31 into the second accommodating space S2 and abuts against the second mating connector L2 inserted in the second accommodating space S2. The second heat dissipating member body 31 comprises a plurality of fin-type heat dissipating components.

As shown in FIG. 6 and FIG. 7, the interface connector 1 also comprises a connecting member 40. The first heat dissipating member 20 comprises a first through hole 24. The housing 10 comprises a second through hole 19. The second heat dissipating member 30 comprises a groove hole 33. The connecting member 40 passes through the first through hole 24 and the second through hole 19 in order and is engaged with the groove hole 33. Specifically, in this embodiment, the connecting member 40 passes through the housing 10 and is connected with the first heat dissipating member 20 and the second heat dissipating member 30. The first extending part 22 of the first heat dissipating member 20 comprises a first through hole 24. The sidewall 13 of the housing 10 comprises a second through hole 19. A side edge of the second heat dissipating member body 31 of the second heat dissipating member 30 comprises a groove hole 33. The connecting member 40 passes through the first through hole 24 and the second through hole 19 in order and is engaged with the groove hole 33. The heat generated by the second mating connector L2 is conducted to the second heat dissipating member body 31 through the third extending part 32 by heat conduction and particularly dissipated through the fin-type heat dissipating component of the second heat dissipating member body 31 along with external air flow by heat convection. The heat conducted from the second mating connector L2 to the second heat dissipating member body 31 can also be conducted to the first extending part 22 of the first heat dissipating member 20 then to the first heat dissipating member body 21 through the connecting member 40, and particularly dissipated through the fin-type heat dissipating component of the first heat dissipating member body 21 along with external air flow by heat convection. To increase the heat flow of conduction, a plurality of connecting members 40 could be disposed. In this embodiment, four connecting members 40 are provided. The second heat dissipating member 30 and the connecting member 40 are made of materials with excellent heat conductivity, such as metallic copper.

As shown in FIG. 2, FIG. 3, FIG. 5, FIG. 6, and FIG. 7, in this embodiment, the interface connector 1 further comprises a first elastic member 50 disposed in the first accommodating space S1. The first elastic member 50 and the first heat dissipating member 20 are oppositely located at an opposite position in the first accommodating space S1, respectively. Two opposite surfaces of the first mating connector L1 respectively abut against the second extending part 23 of the first heat dissipating member 20 and the first elastic member 50. In this embodiment, the first elastic member 50 comprises a plurality of arc elastic pieces S1. When the first mating connector L1 is inserted into the first accommodating space S1, the arc elastic piece 51 would be deformed, thereby applying an elastic force to the first mating connector L1 to allow the first mating connector L1 to be more tightly abutted against the second extending part 23 of the first heat dissipating member 20 to reduce the thermal resistance of heat conduction, increase heat flow of heat conduction, and improve heat dissipation of the first mating connector L1. In this embodiment, the front end of the first elastic member 50 is provided with a U-shaped sleeve part 52. The first elastic member 50 is sleeved on the front end of the partitioning part 15 through the sleeve part 52 to be positioned on the partitioning part 15.

As shown in FIG. 2, FIG. 3, FIG. 5, FIG. 6, and FIG. 7, in this embodiment, the interface connector 1 further comprises a second elastic member 60 disposed in the second accommodating space S2. The second elastic member 60 and the second heat dissipating member 30 are oppositely located at an opposite position in the second accommodating space S2, respectively. Two opposite surfaces of the second mating connector L2 respectively abut against the second heat dissipating member 30 and the second elastic member 60. In this embodiment, the second elastic member 60 comprises a plurality of arc elastic pieces 61. When the second mating connector L2 is inserted into the second accommodating space S2, the arc elastic piece 61 would be deformed, thereby applying an elastic force to the second mating connector L2 to allow the second mating connector L2 to be more tightly abutted against the third extending part 32 of the second heat dissipating member 30 upward to reduce the thermal resistance of heat conduction, increase heat flow of heat conduction, and improve heat dissipation of the second mating connector L2. In this embodiment, the front end of the second elastic member 60 is provided with a clip sheet 62, through which the second elastic member 60 is clipped to the bottom wall 12 of the housing 10. In this way, the second elastic member 60 can be positioned on the housing 10.

As shown in FIG. 6, in this embodiment, the interface connector 1 further comprises a third heat dissipating member 70. The third heat dissipating member 70 is disposed in the housing 10 and is located in the third accommodating space S3 and the fourth accommodating space S4. The third accommodating space S3 accommodates the third mating connector, and the fourth accommodating space S4 accommodates the fourth mating connector. The first heat dissipating member 20 extends into the third accommodating space S3 to be connected to the third mating connector, and the third heat dissipating member 70 extends into the fourth accommodating space S4 to be connected to the fourth mating connector. The third heat dissipating member 70 is connected with the first heat dissipating member 20 through the connecting member 40.

In summary, embodiments of the present disclosure provide an interface connector. The first heat dissipating member is disposed at the outside of the housing and is connected to the first mating connector, and the second heat dissipating member is disposed inside the housing and is connected to the second mating connector. The second heat dissipating member is connected to the first heat dissipating member. The heat from the first mating connector is transferred to the first heat dissipating member by heat conduction, and then is dissipated to the air through the first heat dissipating member. The heat from the second mating connector stacked with the first mating connector is transferred to the second heat dissipating member by heat conduction, then is transferred from the second heat dissipating member to the first heat dissipating member by heat conduction, and finally escapes to the air through the first heat dissipating member. By disposing the first heat dissipating member and the second heat dissipating member at the outside and the inside of the housing, and by connecting the first heat dissipating member with the second heat dissipating member, the heat emitted by the first mating connector and the second mating connector can be effectively dissipated through the connected first heat dissipating member and the second heat dissipating member. The heat dissipation issue of optical modules equipped with high power chips can be well handled.

It is to be understood that the term "comprises", "comprising", or any other variants thereof, is intended to encompass a non-exclusive inclusion, such that a process, method, article, or device of a series of elements not only comprise those elements but further comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. An interface connector, comprising:
   a housing, a first accommodating space, and a second accommodating space being disposed in the housing, the first accommodating space being adjacent to the second accommodating space, the first accommodating space accommodating a first mating connector, the second accommodating space accommodating a second mating connector;
   a first heat dissipating member disposed at the outside of the housing and passing through the housing, the first heat dissipating member extending into the first accommodating space to being connected to the first mating connector; and
   a second heat dissipating member disposed in the housing, the second heat dissipating member extending into the second accommodating space to being connected to the second mating connector, wherein the second heat dissipating member comprises a second heat dissipating member body and a third extending part; the third extending part extends from the second heat dissipating member body into the second accommodating space and abuts against the second mating connector inserted in the second accommodating space.

2. The interface connector according to claim 1, wherein the housing comprises a first outer surface and a second outer surface adjacent to the first outer surface; the first heat dissipating member comprises a first heat dissipating member body and a first extending part; the first heat dissipating member body is disposed on the first outer surface; the first extending part extends from the first heat dissipating member body along the second outer surface.

3. The interface connector according to claim 2, wherein the first heat dissipating member further comprises a second extending part extending from the first heat dissipating member body into the first accommodating space through the housing; the second extending part abuts against the first mating connector inserted in the first accommodating space.

4. The interface connector according to claim 1, wherein the second heat dissipating member is connected with the first heat dissipating member.

5. The interface connector according to claim 4 comprising a connecting member passing through the housing and being connecting with the first heat dissipating member and the second heat dissipating member.

6. The interface connector according to claim 5, wherein the first heat dissipating member comprises a first through hole; the housing comprises a second through hole; the second heat dissipating member comprises a groove hole; the connecting member passes through the first through hole and the second through hole in order and is engaged with the groove hole.

7. The interface connector according to claim 1, wherein the housing comprises a partitioning part partitioning the inner space of the housing to form the first accommodating space and the second accommodating space; the second heat dissipating member is engaged with the partitioning part.

8. The interface connector according to claim 1 comprising a first elastic member disposed in the first accommodating space, the first elastic member being opposite to the first heat dissipating member, two opposite surfaces of the first mating connector abutting against the first heat dissipating member and the first elastic member, respectively.

9. The interface connector according to claim 1 comprising a second elastic member disposed in the second accommodating space, the second elastic member being opposite to the second heat dissipating member, two opposite surfaces of the second mating connector abutting against the second heat dissipating member and the second elastic member, respectively.

10. The interface connector according to claim 8 comprising a second elastic member disposed in the second accommodating space, the second elastic member being opposite to the second heat dissipating member, two opposite surfaces of the second mating connector abutting against the second heat dissipating member and the second elastic member, respectively.

11. The interface connector according to claim 1 comprising a third heat dissipating member disposed in the housing, the housing comprising a third accommodating space and a fourth accommodating space, the third accommodating space accommodating a third mating connector, the fourth accommodating space accommodating a fourth mating connector, the first heat dissipating member extending into the third accommodating space to being connected to the third mating connector; the third heat dissipating member extending into the fourth accommodating space to being connected to the fourth mating connector, the third heat dissipating member being connected with the first heat dissipating member.

* * * * *